United States Patent
Thompson et al.

(10) Patent No.: US 7,181,977 B2
(45) Date of Patent: Feb. 27, 2007

(54) SENSOR ASSEMBLY WITH LEAD ATTACHMENT

(75) Inventors: Mitchell Thompson, Exton, PA (US); Kyung-Tae Park, Berwyn, PA (US); Cheng Young Hong, Shenzhen (CN)

(73) Assignee: Measurement Specialties, Inc., Hampton, VA (US)

( * ) Notice: Subject to any disclaimer, the term of this patent is extended or adjusted under 35 U.S.C. 154(b) by 92 days.

(21) Appl. No.: 10/349,482

(22) Filed: Jan. 22, 2003

(65) Prior Publication Data

US 2003/0214200 A1 Nov. 20, 2003

Related U.S. Application Data

(60) Provisional application No. 60/350,553, filed on Jan. 22, 2002.

(51) Int. Cl.
*G01B 7/16* (2006.01)
*G01L 1/00* (2006.01)

(52) U.S. Cl. ..................................................... 73/777

(58) Field of Classification Search ................ 73/777, 73/105; 29/595, 25.35; 310/329
See application file for complete search history.

(56) References Cited

U.S. PATENT DOCUMENTS

| | | | |
|---|---|---|---|
| 4,694,687 A * | 9/1987 | Bonin et al. | 73/116 |
| 4,912,822 A * | 4/1990 | Zdeblick et al. | 29/25.35 |
| 4,991,283 A * | 2/1991 | Johnson et al. | 29/595 |
| 5,129,132 A * | 7/1992 | Zdeblick et al. | 29/25.35 |
| 5,553,486 A * | 9/1996 | Bonin | 73/105 |
| 6,429,670 B2 * | 8/2002 | Tabota et al. | 324/754 |

* cited by examiner

*Primary Examiner*—Michael Cygan
*Assistant Examiner*—Octavia Davis
(74) *Attorney, Agent, or Firm*—Plevy, Howard & Darcy, PC (57) ABSTRACT

A beam-type sensor capable of measuring displacement or acceleration includes a thin, flexible sheet of piezoresponsive material defining broad sides and a proximal end. In order to optimize boundary conditions, the proximal end of the sheet is supported by a clamp that provides a "clean" transition between support and no-support. Electrical connections to conductors associated with the broad sides are integrated into the clamp. In one embodiment, two sheets of piezoelectric material are connected electrically in parallel. In another embodiment, two sheets of piezoelectric material are connected electrically in series.

32 Claims, 10 Drawing Sheets

PATTERN: C
+

FIG. 1I

PATTERN: D
+  −

SENSOR ASSEMBLY WITH LEAD ATTACHMENT

This application claims the priority of Provisional Application No. 60/350,553, filed Jan. 22, 2002.

FIELD OF THE INVENTION

The invention relates to piezoresponsive sensors, and more particularly to cantilevered piezoresponsive sensors with particular mechanical support boundary conditions and electrical interconnections.

BACKGROUND OF THE INVENTION

Certain semi-crystalline polymers, such as polarized fluoropolymer polyvinylidene fluoride (PVDF) are known to have piezoresponsive properties, which may include piezoelectric response. For this reason, PVDF has been used in various sensors to produce a voltage as a function of force or displacement. Depending upon the structure of a sensor using a piezoresponsive material, and its orientation and the manner of deformation of the piezoresponsive material, a useful response may be developed at electrodes located at various regions of the piezoresponsive material. For example, electrical connections can be made to conductive polymer, metallized foil, or conductive paint laminates or sandwiches containing the piezoresponsive material. The signal produced by such a piezoresponsive material may be in the form of a change in electrical resistance, in the generation of a charge, or the generation of a voltage.

Polymer resin piezoelectric materials are particularly useful because the polymers can be embodied as sensing elements which are both flexible and elastic, and develop a sense signal representing resiliently biased deformation when subjected to force. In the case of PVDF piezoelectric polymer, the sensing element is advantageously embodied as a thin strip. The piezoelectric element is oriented so that the strip is deflected, as by compression or stretching (tension) by the applied force, and two or more electrical contacts are made with the material, so that a voltage signal is produced in response to the force. The voltage is produced because deformation of the polymer material changes the relative positions of charges in the polymer chain or in the semi-crystalline lattice structure. Such sensing elements are useful over a range of frequencies, ranging from near-zero frequencies associated with direct current, up to ultrasound frequencies associated with alternating current. In addition to the sensing of forces, acceleration and displacement, such piezoresponsive sensors can be used in other contexts, such as for the sensing of changes in temperature, or for operation as a switch for generating a trigger signal for operation of a MOSFET or CMOS circuit.

A multi-mode accelerometer is described in U.S. Pat. No. 5,452,612. Another accelerometer is described in U.S. Pat. No. 6,252,335. A rate-responsive pacemaker including an accelerometer-based physical activity sensor is described in U.S. Pat. No. 5,833,713. U.S. Pat. No. 6,252,335 describes a beam accelerometer.

Low-cost cantilever beam type shock sensors are commercially available, as for example the Measurement Specialties Inc. LDTX and LDTM series. Incorporation of these devices into useful products requires the product designer to develop secure and reliable cantilever-clamped/free region boundary conditions so that the conditions at the mechanical boundary between the supported and the free portions of the beam can be predicted and maintained constant from unit to unit. When the electrical response of a piezoresponsive sensor in response to a particular mechanical stimulus may be insufficient, it may be desirable to concatenate together multiple sensors. The concatenation of two or more piezoresponsive sensors into a single unit additionally implicates the problems of achieving the proper electrical interconnections among the individual sensors. Additional problems associated with the design of piezoresponsive sensors lie in the temperature sensitivity of the piezoelectric materials, which may be damaged by overheating attributable to soldering of the electrical connections of the sensor unit to a utilization device. Improved devices are desired.

SUMMARY OF THE INVENTION

Thus, a sensor according to an aspect of the invention comprises a first sheet of piezoresponsive material defining first and second broad sides, and also defining, in registry on the first and second broad sides, first, second and third nonoverlapping regions. A first sheet of electrical conductor extends over, and is in contact with, the first broad side of the first sheet of piezoresponsive material in the second and third regions of the first broad side and does not extend over, or contact, the first broad side in the first region. A second sheet of electrical conductor extends over, and is in contact with, the second broad side of the first sheet of piezoresponsive material in the first and second regions of, and does not extend over, or contact, the second broad side of the first sheet of piezoresponsive material in the third region. As a result, or whereby, that second region of the first sheet of piezoresponsive material lying between the second regions of the second and third sheets of conductive material, when strained or flexed, produces a sensor response, which may be a voltage, between the second and third sheets of electrical conductor. The sensor also includes first and second electrically conductive means making contact with the first and second sheets of electrical conductor, for making signals from the first sheet of piezoresponsive material available as a sensor signal.

In a variant of this aspect of the invention, the sensor further comprises a third sheet of electrical conductor extending over, and in contact with, the first broad side of the first sheet of piezoelectric material in the first region, and not extending over or in contact with the first broad side of the first sheet of piezoelectric material in the second and third regions, the first and third sheets of electrical conductor being electrically isolated from each other.

In yet another variant of this aspect of the invention, the sensor further comprises at least one plated-through hole extending through the first sheet of piezoresponsive material in the first region, for making electrical connection between the second and third sheets of electrical conductor. In such an arrangement, the first and second electrically conductive means make electrical contact with the second sheet of electrical conductor through the plated-through hole.

When used at frequencies below the resonant frequency of the beam structure, a piezoresponsive sensor in accordance with embodiments of the present invention can operate as an accelerometer, providing an electrical response which may be linearly related to the acceleration of the beam support in a direction normal to the upper surface of the beam. When operated at a frequency above the resonant frequency of the beam structure, the sensor operates as a displacement transducer, providing an electrical response which may be linearly related to the displacement of the beam support. When operated below resonance, the sensor provides an electrical response which may be linearly related to the displacement of the tip of the beam relative to the beam support structure.

DESCRIPTION OF THE INVENTION

Figure 1A:
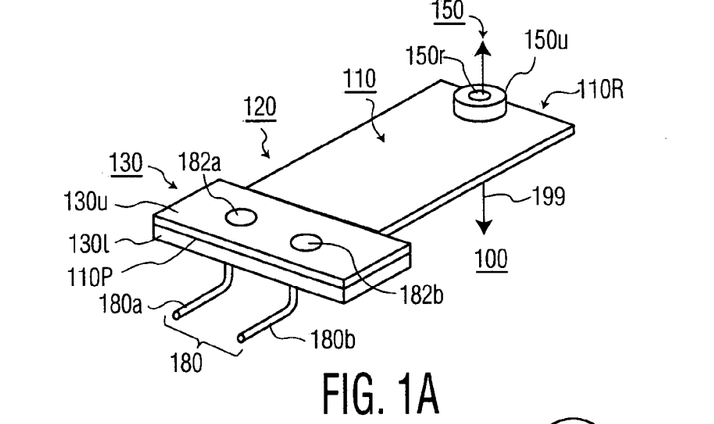
FIG. 1a is a simplified perspective or isometric view of a sensor assembly according to an aspect of the invention, including a piezoresponsive assembly.
Figure 1B:
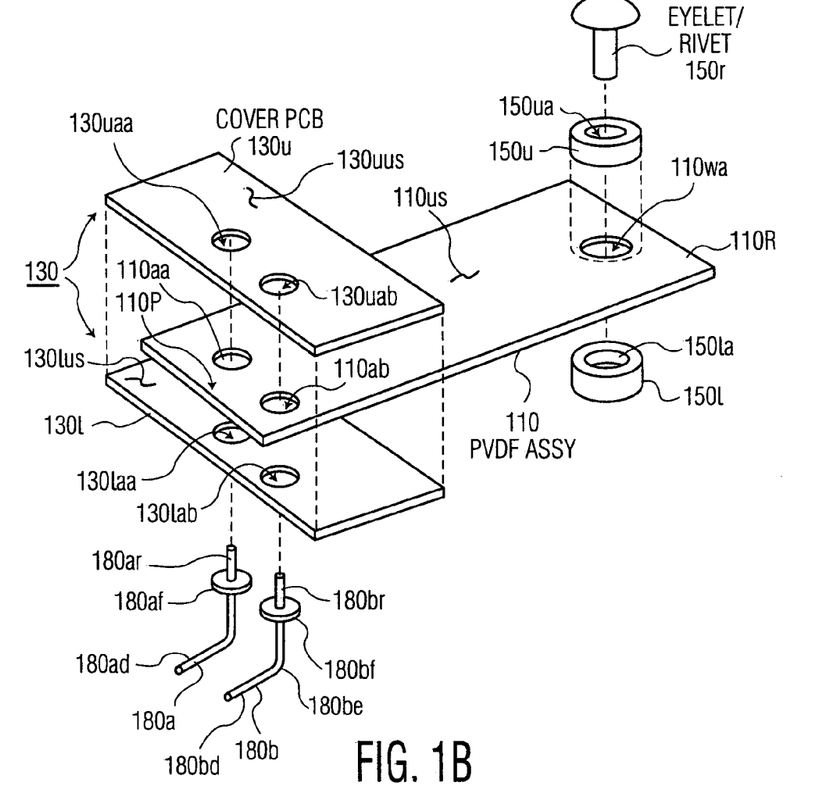
FIG. 1b is a simplified exploded perspective or isometric view of the structure of FIG. 1a, FIG. 1c is a side cross-sectional view of the sensor assembly of FIG. 1a, FIG. 1d is a plan view of the structure of FIG. 1a, FIG. 1e is a simplified, exploded, perspective or isometric view of the piezoresponsive assembly of FIG. 1a, FIG. 1f is a representation of the longitudinal extent of the various constituents of the piezoresponsive assembly of FIG. 1e, FIGS. 1g, 1h, 1i, and 1j are plan views of some conductors of the piezoresponsive assembly of FIG. 1e.

In FIGS. 1a and 1b, the sensor 100 includes a sheet or sheet assembly 110 of piezoresponsive material defining proximal 110P and distal 110R ends, with various conductors for making electrical connection between the sheet piezoresponsive material and the outside world. In FIGS. 1a and 1b, sheet assembly 110 is connected at a proximal end 110l to a structure designated generally as 120, which includes a printed-circuit assembly designated generally as 130 and also includes an electrical connection arrangement designated generally as 180. Sheet assembly 110 is supported at and near its proximal end or side 110P by printed-circuit assembly 130. Printed-circuit (pc) assembly 130 includes upper and lower pc boards 130u and 130l, respectively, which are fastened together, with the piezoresponsive sheet assembly 110 clamped therebetween.

As mentioned, piezoresponsive assembly 110 of FIGS. 1a and 1b is supported at one end by printed-circuit assembly 130. That end 110R of piezoresponsive assembly 130 which is remote from printed-circuit assembly 130 supports a weight or mass designated generally as 150 in a cantilever manner. Any movement of the sensor 100 in the direction of double-headed arrow 199 will tend to bend the piezoresponsive assembly 110. It may be advantageous to have mass 150 made from a magnetically permeable material or to be magnetic.

Ring mass 150 of FIGS. 1a and 1b is bipartite, with a first portion 150u on the upper side of the piezoresponsive assembly 110, and a second portion 150l on the lower side. Each part 150u and 150 defines a through aperture 150ua and 150la, respectively, to aid in fastening the weight to the remote end 110R of the piezoresponsive assembly 110. A rivet, eyelet or screw arrangement illustrated as 150r extends through the apertures 150ua and 150la of the weight, and through an aperture 110wa in the piezoresponsive assembly 110.

The near end (as illustrated in FIG. 1b) of sheet 110 defines a pair of apertures 110aa and 110ab. Electrical connection arrangement 180 of FIGS. 1a and 1b includes bent pins 180a and 180b, which provide both physical support of sensor 100 and electrical terminals at which the sensed signal can be received. As shown in FIGS. 1a and 1b, the pins extend a predetermined distance in a plane perpendicular to the plane of the assembly before bending at bend 180be such that distal portions 180ad, 180bd of the pins lie in a plane parallel to the plane of the assembly. In this manner, the bent pins may be mounted to a vertical surface for sensing horizontal accelerations. Alternatively, straight pins that extend from the assembly only in the plane perpendicular thereto are also contemplated, for example, for mounting onto a horizontal surface for sensing vertical accelerations. Upper printed circuit board 130u defines apertures 130uaa and 130uab registered with apertures 130laa and 130lab, respectively, of lower printed circuit board 130l, and also registered with apertures 110aa and 110ab, respectively, in sheet 110. Each of pins 180a and 180b includes a flange 180af and 180bf, respectively, which are intended to bear on the underside of printed circuit board 130l, with a remote portion 180ar, 180br of pins 180a, 180b, respectively, projecting through an aperture 110a, 110b. Remote portions 180ar and 18br of pins 180a and 180b, respectively, are dimensioned to project at least part-way through apertures in the juxtaposed printed-circuit boards 130. More particularly, remote end 180ar of pin 180a projects at least partway through registered apertures 130laa, 110aa, and 130uaa, and remote end 180br of pin 180 projects at least part-way through registered apertures 130lab, 110ab, and 130uab. It should be noted that the sensed signal may be in the form of a change in resistance or in the form of a voltage or charge. When bent pins 180a and 180b are inserted into an underlying printed-circuit board (not illustrated) the sensor 100 projects "vertically" from the underlying printed-circuit board.

Two elements 182a and 182b are illustrated on the upper surface of printed-circuit board 130u of FIG. 1a. Reference to the cross-section of FIG. 1c reveals that these elements are the visible portions of fasteners which, together with portions of pins 180, hold the printed-circuit boards 130u, 130l together. Fasteners 182a and 182b may be screws threaded into appropriately threaded apertures (not illustrated) in the remote ends 180ar, 180br of pins 180a and 180b, respectively, or they may be the peened-over remote ends of the pins themselves, so they may be considered to be the ends of rivets. In the cross-section of FIG. 1c, the fastener 182b can be seen to be a screw.

Figure 1C:
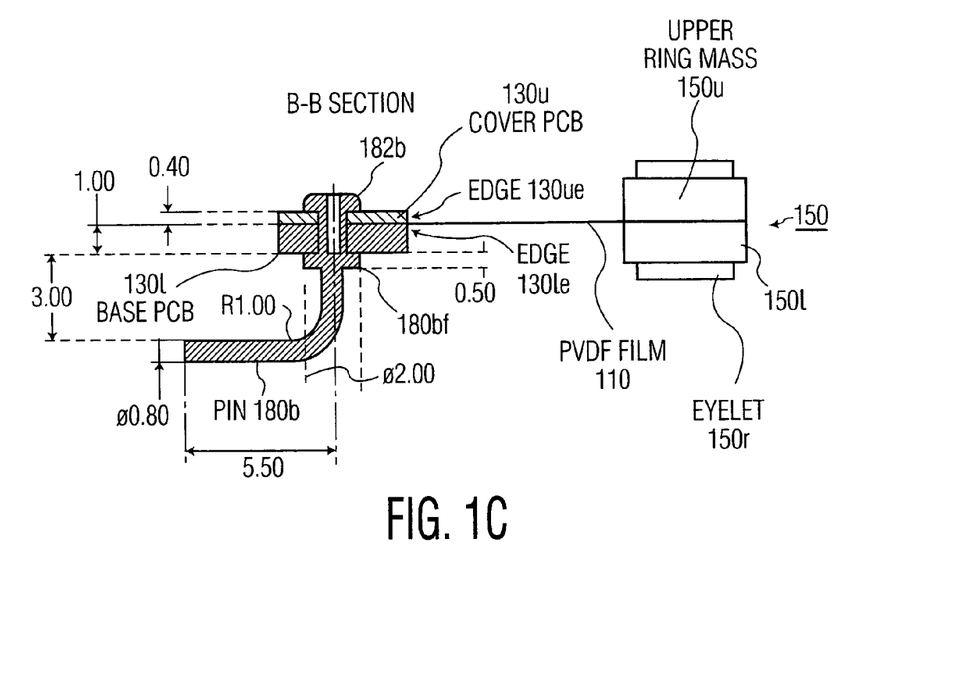
Figure 1D:
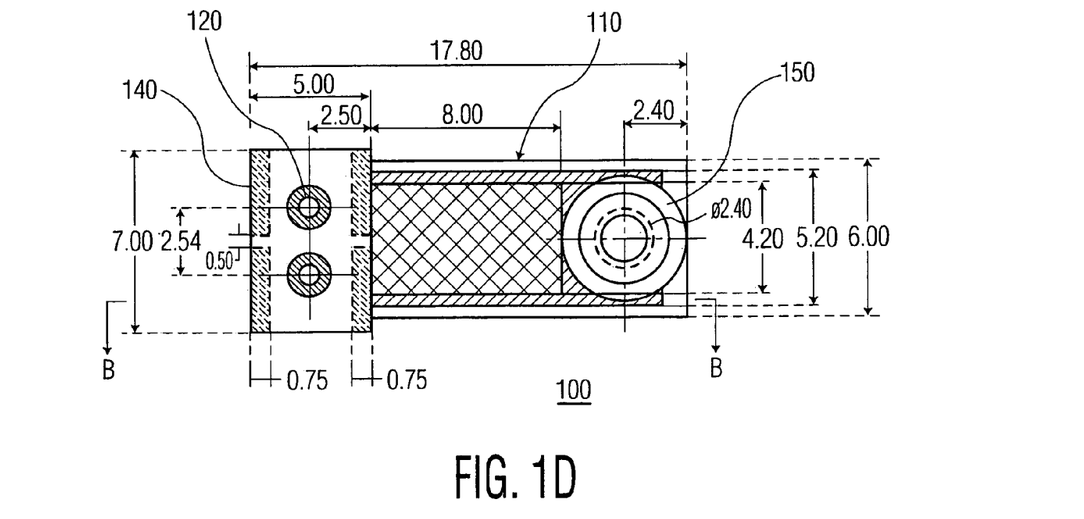

FIG. 1d is a plan view of the structure illustrated in FIGS. 1a, 1b, and 1c, showing some dimensions in millimeters, and also illustrating some artwork which may be placed on the visible portion of the piezoresponsive assembly 110.

Figure 1E:
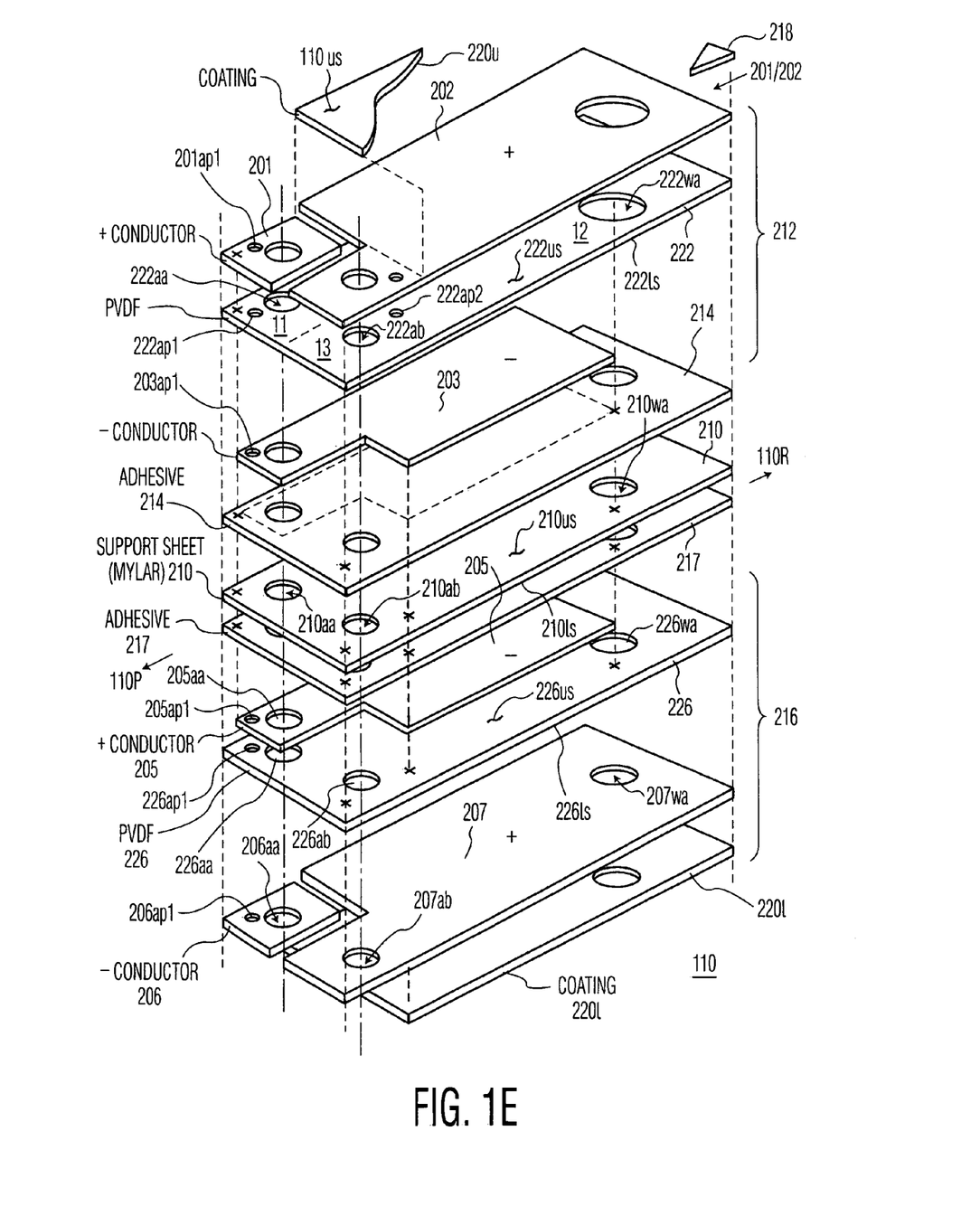

FIG. 1e illustrates the composition of sheet assembly 110 of piezoresponsive material. In FIG. 1e, sheet of piezoresponsive material 110 is a flexible generally rectangular structure including a support sheet 210 of flexible material located near the center of the structure. Support sheet 210 is mechanically coupled to the piezoresponsive material for aiding in support thereof and for providing a neutral flexural axis for the overall assembly such that average length extensional stress through the thickness of the piezoresponsive layer resulting from flexure of the tip has enhanced magnitude. In a particular embodiment of the invention, support sheet 210 is of a polymer material, such as MYLAR, but it may be any flexible material, such as a metal. Support sheet 210 as illustrated has an upper surface 210us and a lower surface 210ls. The near end of support sheet 210 defines apertures 210aa and 210ab, which are located at positions corresponding to the locations of apertures 110aa and 110ab of FIG. 1b. The far end of support sheet 210 defines an aperture 210wa at a location corresponding to the location of aperture 110wa of FIG. 1b. The layers 214 and 217 immediately above and below support sheet 210 are layers of adhesive material. The upper layer 214 of adhesive material affixes to the upper surface 210us of support sheet 210 a first or upper composite sheet, designated generally as 212. Similarly, the lower adhesive layer 217 of adhesive material affixes to the lower surface 210ls of support sheet 210 a second or lower composite sheet, designated generally as 216. Each of composite sheets 212 and 216 is itself a composite of a layer or sheet of piezoresponsive material such as piezoelectric PVDF with a conductive layer in contact with each broad surface. Thus, upper composite sheet 212 includes a piezoresponsive sheet 222 defining a broad upper surface 222us and a broad lower surface 222ls, and lower composite sheet 216 includes a piezoresponsive sheet 226 defining broad upper and lower sufaces 226us and 226ls, respectively, with a conductive layer in contact with each broad surface.

Figure 1F:
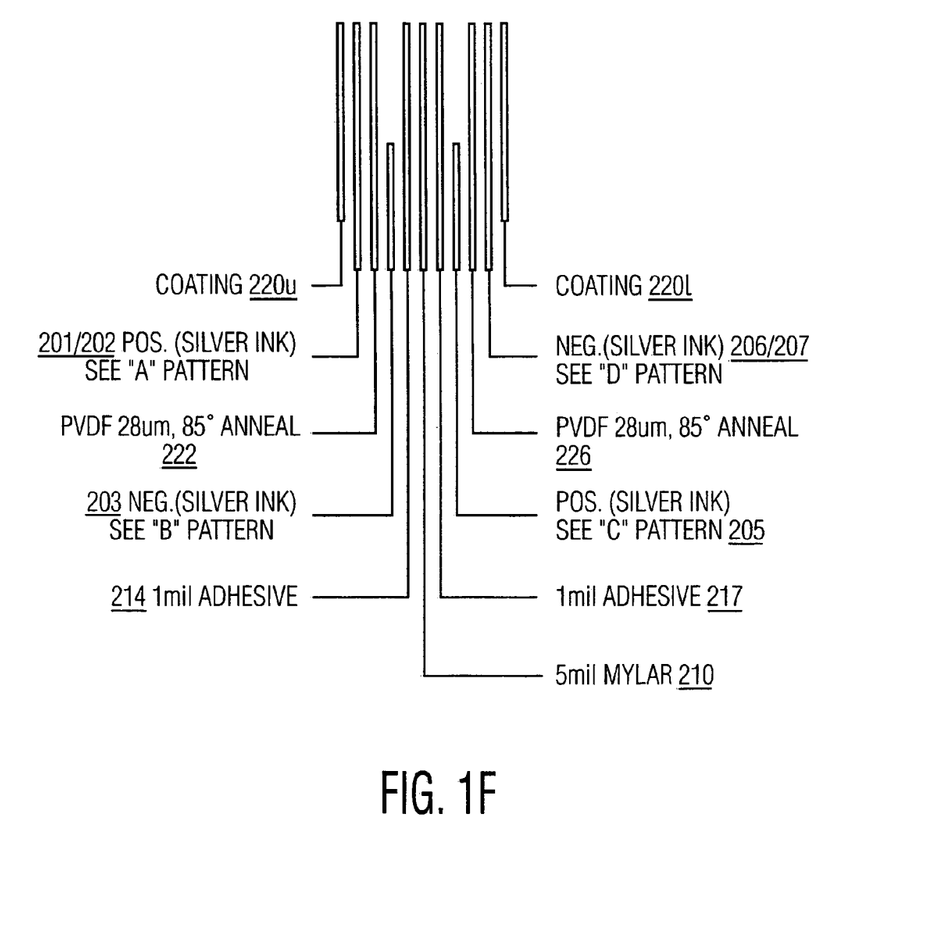

As illustrated in FIG. 1e, upper piezoresponsive sheet 222 of composite sheet 212 defines near-end apertures 222aa and 222ab and far-end aperture 222wa, all registered with corresponding apertures of flexible support sheet 210, for like purposes. The upper surface 222us of piezoresponsive sheet 222 is in contact with a patterened layer or film 201/202 of electrical conductor, and the lower surface 222ls of piezoresponsive sheet 222 is similarly in contact with a patterned layer or film 203 of conductor. In order to describe the regions of the upper and lower surfaces of piezoresponsive sheet 222 to which the portions of the patterned conductor are applied, reference is made to FIG. 1k. FIG. 1k represents a plan view of piezoresponsive sheet 222 of FIG. 1e, partitioned into three nonoverlapping regions 11, 12, and 13 by first and second mutually orthogonal dash lines 88 and 89. These regions 11, 12, and 13 may be considered to extend through the sheet, so that corresponding regions are registered on both upper and lower sides of piezoresponsive sheet 222.

Figure 1G:
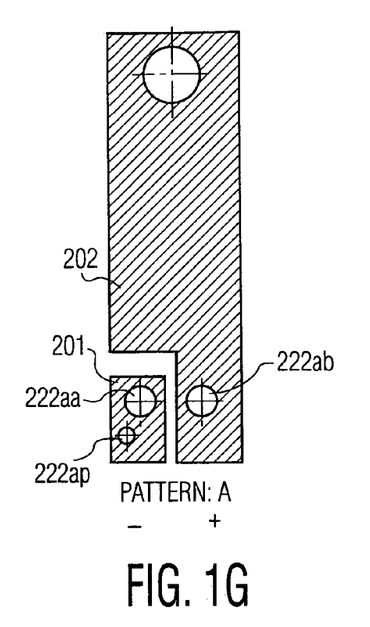
Figure 1H:
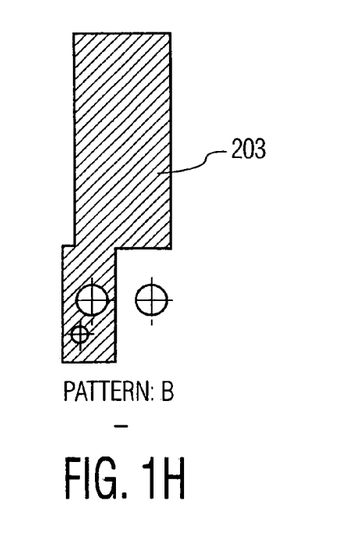

FIG. 1g illustrates in plan view a possible layout of conductive layer 201/202 of FIG. 1e. In FIG. 1e, upper surface 222us of piezoresponsive sheet 222 is overlain in region 11 by a patterned conductor layer or film portion 201, and in regions 12 and 13 by a contiguous patterned conductor 202. Patterned conductive layer or film portions (sheets) 201 and 202 are not in direct electrical contact with each other. Lower surface 222ls of piezoresponsive sheet 222 is "underlain" by conductive layer or film (sheet) 203. Thus, conductive sheet 203 of FIG. 1e underlies, and is in contact with, the lower surface 222ls of piezoresponsive sheet 222 in regions 11 and 12. FIG. 1h illustrates in plan view one possible layout of conductive sheet 203 of FIG. 1e. Electrically conductive sheets 201, 202, and 203 define apertures at locations corresponding to the apertures of piezoresponsive sheet 222.

It will be noted that the presence of printed circuit board 130 of FIGS. 1a and 1b clamps a portion of the composite assembly 110 in a region roughly corresponding to regions 11 and 13 of FIG. 1k, preventing any bending of the composite sheet in this region. Since the composite sheet cannot bend in this region in response to bending moments attributable to the mass 150, no piezoresponsive voltages (hereinafter "piezoelectric voltages") can appear between the top and bottom (upper surface 222us, lower surface 222ls) of piezoelectric sheet 222 of FIG. 1e in regions 11 and 13. Thus, bending of composite arrangement 110 in use does not produce any voltage on conductive region 201 in region 11 relative to that portion of conductor 202 lying in region 11. In effect, conductor 201 is a mere conductive pad, available for making contact with a conductor (not illustrated) of the printed circuit board 130u of FIG. 1b. However, electrical conductors 202 and 203 of FIG. 1e lie on opposite sides of piezoelectric sheet 222 in a region in which bending can occur, and respond electrically. In a piezoresistive material, the resistance will change between those portions of conductive sheets 202 and 203 which overlie/underlie the same portion of the piezoresponsive sheet 222 when the sheet is flexed. In the case of piezoelectric material, an electrical voltage will appear between conductive sheets 202 and 203 in response to flexure. It should be noted that conductive sheet 203 does not extend as far toward remote end 110R as does sheet 203, to thereby assure that flexure of the piezoresponsive sheet 110 of FIGS. 1a and 1b attributable to anomalies associated with the presence of aperture 110wa do not affect the linearity or reproducibility of the sensor.

It will be noted that conductive sheet 203 is located within the interior of the structure of piezoresponsive assembly 110, while sheet 202 lies near the outer portion. In order to provide for convenient electrical connection to inner layer 223 of conductor, a set of registered apertures 201apl, 222apl, and 203apl are defined through layers 201, 222, and 203, respectively, and plated through to provide electrical connection between conductive layer 203 and outer layer 201. As mentioned, conductive layer 201 is not responsive to flexure, so its presence simply provides a convenient connection pad for electrical access to conductor layer 203. When piezoresponsive assembly 110 is flexed, the electrical response attributable to piezoresponsive sheet 222 is felt "between" (in the electrical sense of the word, rather than in the mechanical or position sense of the word) the accessible portions of conductors 201 and 202. More particularly, when assembly 110 is piezoelectric and is flexed in a particular direction, which for example may be "down at the remote end," a voltage is felt which is arbitrarily defined as positive (+) on conductor 201 (and 203) and negative (−) on conductor 202.

Figure 1I:
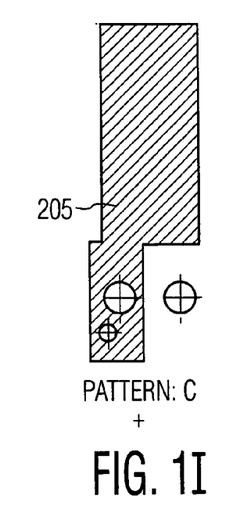
Figure 1J:
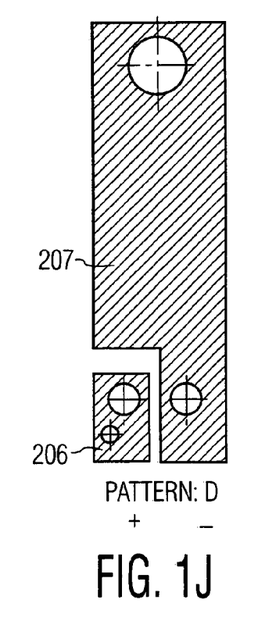
Figure 1K:
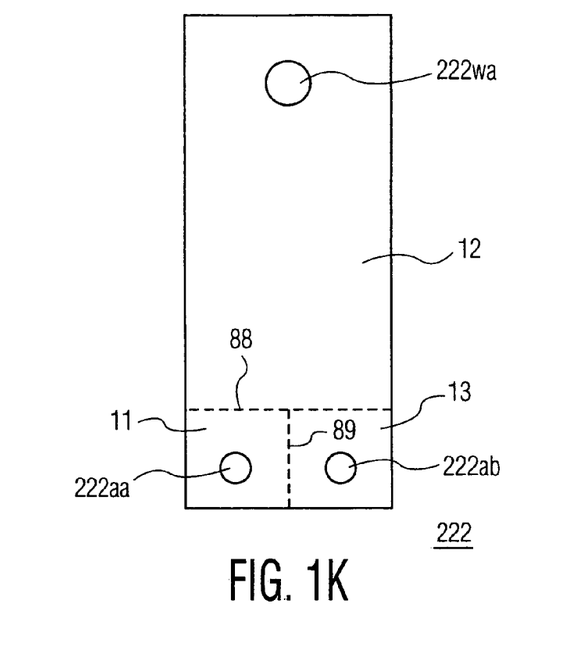
FIG. 1k is a plan view of the piezoelectric assembly of FIG. 1a, with conceptual partitions into three regions.

As illustrated in FIG. 1e, lower piezoresponsive sheet 226 of composite sheet 216 defines near-end apertures 226aa and 226ab and far-end aperture 226wa, all registered with corresponding apertures of flexible support sheet 210 and with corresponding apertures associated with piezoresponsive sheet 212, for like purposes. The upper surface 226us of piezoresponsive sheet 226 is in contact with a patterned layer or film 205 of electrical conductor, and the lower surface 226ls of piezoresponsive sheet 226 is similarly in contact with a patterned layer or film 206/207 of conductor. FIGS. 1i and 1j represent plan views of a possible layout of the conductor sheets 205 and 206/207. The regions of the upper and lower surfaces of piezoresponsive sheet 226 to which portions of the patterned conductors 205 and 206/207 are applied are the same regions 11, 12, and 13 referred to in conjunction with FIG. 1k, and discussed in conjunction with conductor regions 201, 202, and 203. In addition, the regions 11, 12, and 13 associated with conductors 205, 206, and 207 are in registry with the regions 11, 12, and 13 associated with conductors 201, 202, and 203.

In FIG. 1e, upper surface 226us of piezoresponsive sheet 226 is overlain in regions 11 and 12 by a patterned conductor layer or film portion (sheet) 205. Lower surface 226ls of piezoresponsive sheet 226 is "underlain" by conductive layer or film portions (sheets) 206 and 207. Patterned conductive layer or film portions (sheets) 206 and 207 are not in direct electrical contact with each other. Thus, conductive sheet 206 underlies, and is in contact with, lower surface 226ls of piezoresponsive sheet 226 in region 11, and conductive sheet 207 of FIG. 1e underlies, and is in contact with, the lower surface 226ls of piezoresponsive sheet 226 in regions 12 and 13. Electrically conductive sheets 205, 206, and 207 define apertures at locations corresponding to the apertures of piezoresponsive sheet 226.

As mentioned, the presence of printed circuit board 130 of FIGS. 1a and 1b clamps a portion of the composite assembly 110 in a region roughly corresponding to regions 11 and 13 of FIG. 1k, preventing any bending of the composite sheet in this region. Thus, bending of composite arrangement 110 in normal use does not produce any voltage on conductive region 206 in region 11 relative to that portion of conductor 205 lying in region 11. In effect, conductor 206 is a mere conductive pad, available for making contact with a conductor (not illustrated) of the printed circuit board 130u of FIG. 1b. However, electrical conductors 205 and 206 of FIG. 1e lie on opposite sides of piezoelectric sheet 226 in a region in which bending can occur, and respond electrically. It should be noted that conductive sheet 205 does not extend as far toward remote end 110R as does sheet 207, for the same reasons given above in regard to conductors 202 and 203.

It will be noted that conductive sheet 205 is located within the interior of the structure of piezoresponsive assembly 110, while sheet 207 lies near the outer portion. In order to provide for convenient electrical connection to inner conductor layer 205, a set of registered apertures 205apl, 226apl, and 206apl are defined through layers 205, 226, and 206, respectively, and plated through to provide electrical connection between conductive layer 205 and outer conductive layer 206. When piezoresponsive assembly 110 is flexed, the electrical response attributable to piezoresponsive sheet 226 is felt "between" (in the electrical sense of the word) the accessible portions of conductors 206 and 207. More particularly, when assembly 110 is piezoelectric and is flexed in a particular direction, which for example may be "down at the remote end," a voltage is felt which, using the same standard applied to sheet 222, is defined as positive (+) on conductor 205 (and 206) and negative (−) on conductor 207.

Piezoresponsive assemblies 212 and 216 of FIG. 1e are bonded by adhesive layers 214 and 217 to upper and lower surfaces 210us and 210ls, respectively, of support sheet 210. An upper cover or coating illustrated as 220u overlies the upper surface of upper conductor sheet 202 at least in region 12, and a lower cover or coating 220l "overlies" the lower surface of lower conductor sheet 207, at least in region 12. Regions 11 and 12 may be left uncoated to facilitate electrical connections to the various metal portions, if desired.

FIG. 1f is a simplified representation of the longitudinal extent of the various layers and sheets of piezoresponsive assembly 110 of FIGS. 1a, 1b, and 1e, showing some of the same elements as are shown in FIG. 1e in a quasi-cross-sectional view.

Referring once more to FIGS. 1a and 1b, note that the remote ends 180ar and 180br of the electrical connection pins extend through apertures 110aa and 110ab of the piezoresponsive assembly 110. The flanges 180af and 180bf make physical and electrical contact with the lower surface of the piezoelectric assembly 110, and the fasteners (rivets, eyelets or screws) 182a and 182b make contact with the upper surface. That being so, fastener 182a of pin 180a of FIG. 1c makes contact with conductor 201 of FIG. 1e, and flange 180af of pin 180a makes contact with conductor 206 of FIG. 1e. Similarly, fastener 182b of pin 180b of FIG. 1c makes contact with conductor 202 of FIG. 1e, and flange 180bf makes contact with conductor 207 of FIG. 1e. Since conductor 201 of FIG. 1e makes electrical contact with conductor 203, pin 182a makes contact with conductor 203 by way of conductor 201. Since conductor sheet or layer 206 of FIG. 1e makes electrical contact with electrical sheet 205 by way of plated-through aperture 226apl, pin 180a also makes contact with sheet 205. Thus, pin 180a is in electrical contact with lower conductor sheet 203 of piezoresponsive subassembly 212 of FIG. 1e and with upper conductor sheet 205 of piezoresponsive subassembly 216. Similarly, pin 180b is in electrical contact with upper conductor sheet 202 of FIG. 1e of piezoelectric subassembly 212 and with lower conductor sheet 207 of piezoresponsive subassembly 216.

The fastening together of piezoresponsive subassemblies 212 and 216 of FIG. 1e by means of support sheet 210 and adhesive layers 214 and 217 means that the piezoresponsive sheets 222 and 226 undergo stresses of opposite polarity when the tip of the structure 110R is flexed. For example, when the tip 110R of piezoresponsive assembly 110 is flexed downward, the piezoresponsive sheet 222 undergoes tensile stress whereas piezoresponsive sheet 226 undergoes compressive stress. In order to provide voltage of the same polarity from piezoelectric sheets 212 and 226 at the pins 180 in response to flexure of the piezoresponsive assembly 110, the polarities of the piezoelectric sheets 212 and 226 are reversed, by "turning over" or reversing from top to bottom one of the piezoelectric sheets 212, 226. Assuming that the polarization of piezoelectric sheet 222 is positive (+) on its upper surface 222us and negative (−) on its lower surface in conventional notation, so that the charge or voltage on upper conductor sheet 202 is + and on lower conductive sheet 203 is −, then piezoelectric sheet 226 is oriented so that its upper surface 226us and conductive sheet 205 are negative (−) and the lower surface 226ls and conductive sheet 207 are positive (+). With this polarity adjustment, pin 180a is connected to both the negative conductors 203 and 205, and pin 180b is connected to both positive conductors 202 and 207. The charge available from this arrangement is twice that available from a single layer of piezoelectric material.

Figure 4:
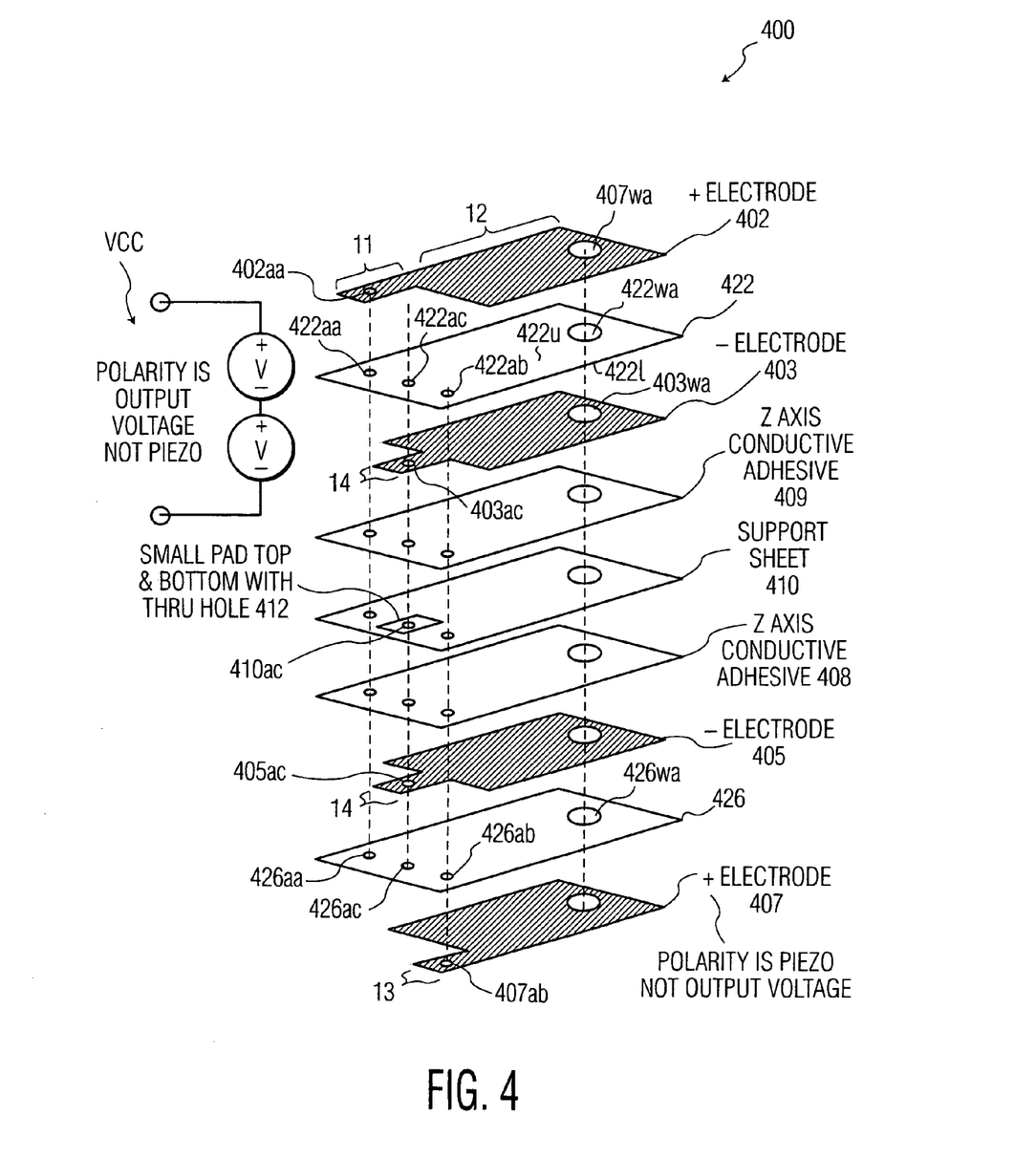
FIG. 4 illustrates an embodiment of the invention wherein two piezoelectric layers are electrically connected in series.

FIG. 4 illustrates an embodiment similar to that described in FIG. 1E, but wherein two piezoelectric layers are electrically connected in series with piezoelectric polarities arranged such that a deflection of the free end of the substrate causes addition of the electrical output from the two piezoelectric layers in a manner that enables an electric potential Vcc to be produced between the outermost electrode of each piezoelectric layer. As illustrated in exploded view in FIG. 4, the assembly 400 comprises an upper composite layer comprising a piezoresponsive layer 422 having an upper surface 422u on which is disposed a patterned electrode layer 402, and lower surface 422l on which is disposed patterned electrode layer 403. Piezoresponsive layer 422 includes apertures 422aa, 422ab, and 422ac disposed at a near end and aperture 422wa at a far end. In like fashion, a lower composite layer comprises a second piezoelectric layer 426 sandwiched between patterned electrode layers 205 and 207, with apertures 426a, 426b, 426c and 426wa, respectively registered with layer 422 apertures 422aa, 422ab, 422ac and 422wa. Support sheet 410 is disposed between the upper and lower composite layers. Support sheet 410 has an upper surface 410u on which is disposed a z-axis electrically conductive adhesive layer 409, and lower surface 410l on which is disposed z-axis conductive adhesive layer 408. Sheet 410, along with conductive adhesive layers 408 and 409 each have corresponding apertures registered with apertures 422aa, 422ab, 422ac and 422wa of layer 422 (and thus with layer 426). Sheet 410 further includes electrically conductive pad 412 disposed on the upper and lower surfaces of sheet 410 about aperture 410ac and electrically connected through aperture 410ac. The adhesive layers thus affix the upper and lower composite layers to one another via the support sheet 410, thereby providing a single composite structure.

As illustrated in FIG. 4, the assembly is partitioned into four nonoverlapping regions 11, 12, 13 and 14. The patterned electrode layers 402 and 403 define overlapping portion 12 and non-overlapping portions 11 and 14 for piezoresponsive layer 422. Electrode layer 402 includes aperture 402aa registered with piezoresponsive layer aperture 422aa, while electrode layer 403 includes aperture 403ac registered with piezoresponsive layer aperture 422ac. Patterned electrode layers 405 and 407 define overlapping portion 12 and non-overlapping portions 13 and 14 for piezoresponsive layer 426. Electrode layer 405 includes aperture 405ac registered with piezoresponsive layer aperture 426ac, while electrode layer 407 includes aperture 407ab registered with piezoresponsive layer aperture 426ab. Conductive pad 412 formed in region 14 is thus in electrical communication with electrodes 403 and 405. The clamping member (not shown) is coupled to the near end of the assembly in a manner analogous to that previously described.

Figure 2:
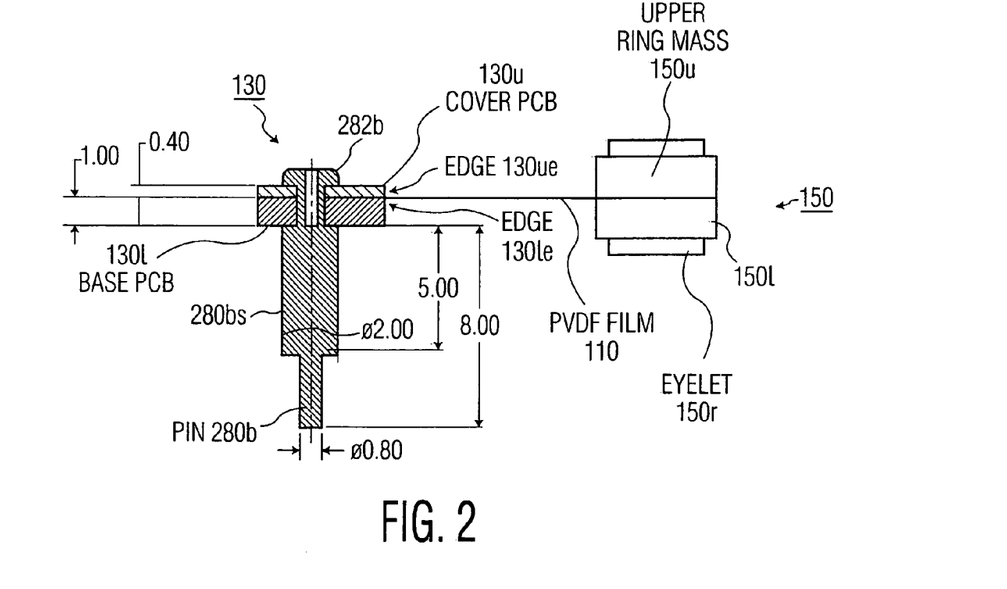
FIG. 2 is a simplified cross-sectional representation, corresponding in general to FIG. 1c, of an embodiment of the invention in which the piezoresponsive assembly is oriented orthogonal to the support pins.

FIG. 2 is a simplified cross-sectional representation, corresponding in general to FIG. 1c, of an embodiment of the invention in which the piezoresponsive assembly is oriented orthogonal to the support pins, or in other words in parallel with the broad surface of the underlying printed-circuit board (not illustrated). In FIG. 2, elements corresponding to those of FIG. 1c are designated by like reference numerals, and are not further discussed. Instead of the bent pin 180b and flange 180bf of FIG. 1c, the arrangement of FIG. 2 has a straight pin 280b projecting from a support 280bs. The upper end of support 280bs of FIG. 2 presents about the same diameter and configuration to the printed-circuit boards 130 as does the flange portion 180bf of pin 180b. Consequently, all the same advantages accrue as are discussed in relation to the sensor 100, with the sole difference being that the orientation of the plane of the piezoresponsive assembly 110 is parallel with the plane of the underlying printed-circuit board rather than vertical.

It will be appreciated that sensors according to the various aspects of the invention may be suitable for use in measurement of displacement of the weighted, distal, or tip end relative to the base or support end in a direction normal or orthogonal to the major surface of the piezoresponsive assembly, and can therefore respond to acceleration or to displacement of the base relative to the distal end or to displacement of the distal end relative to the base.

It will also be appreciated that the configuration of the conductive layers 202 and 207 is such that the conductors tend to enclose the remainder of the piezoresponsive assembly 110, and provide a measure of electrostatic shielding thereto.

Figure 3A:
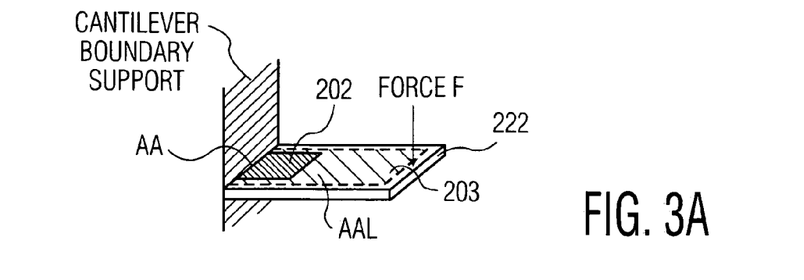
FIGS. 3A and 3B show embodiments wherein conductive electrode layers may be applied only in a specific region of the piezoelectrically active surface of a piezoelectric layer in order to increase sensitivity of the output signal.
Figure 3B:
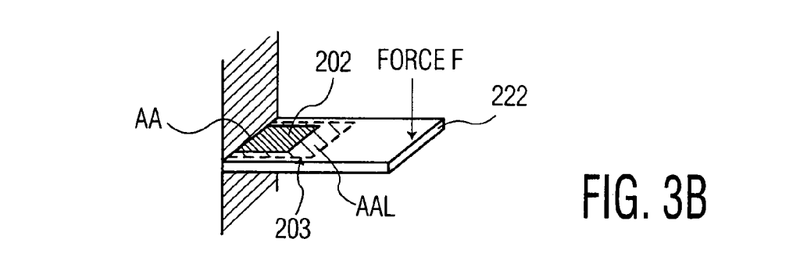

Other embodiments of the invention will be apparent to those skilled in the art. For example, as shown in FIG. 3A, a conductive electrode layer on one or more sides of the piezoelectric layers may be applied only in a specific region of the piezoelectrically active surface of the piezoelectric layer in order to increase sensitivity of the output signal. That is, at least one of the electrode layers is applied only in a region of the piezoelectrically active surface that is substantially less than the total active surface, such that the overlapping portions of the two electrode layers is substantially small compared to the overall surface of the piezoelectric layer. For example, applying conductive electrode layer 202 only to a specific, narrow region AA of piezoelectric layer 222 near the cantilever boundary condition of the support structure (and applying corresponding conductive electrode layer 203 to region AAL of the lower surface of piezoelectric layer 222 overlapping region AA operates to substantially increase the output of the active region. Note that, as shown in FIGS. 3A and 3B, the active electrode region is the area defined by the overlap of electrode layers on both the top and bottom surfaces of the piezoelectric layer. Thus, the active electrode area is the same for FIGS. 3A and 3B.

Figure 3C:
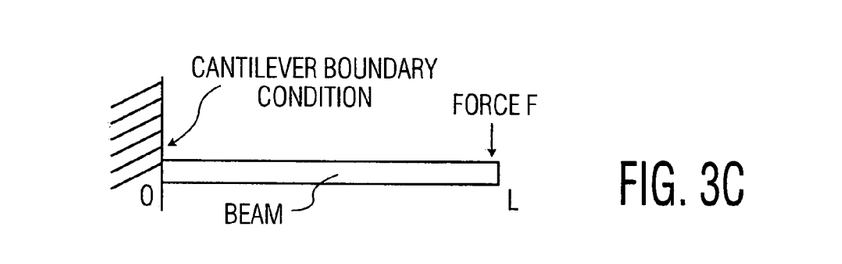
FIG. 3C illustrates a side view of a cantilever beam sensor structure having a force F applied to the tip of the beam.
Figure 3D:
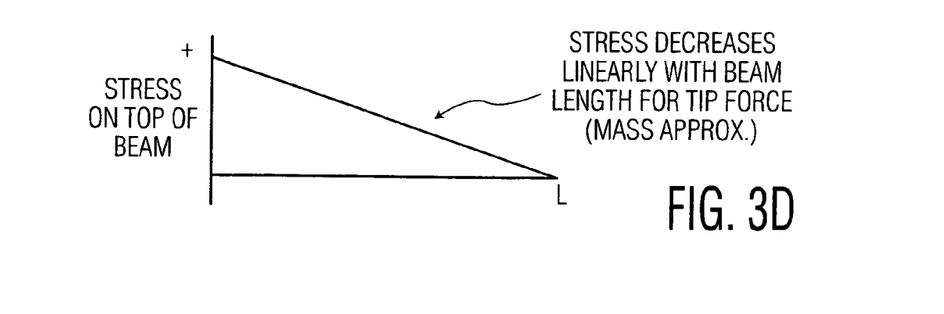
FIG. 3D is a graphical illustration of the stress on the beam, with the stress level decreasing linearly with beam length based on tip force.
Figure 3E:
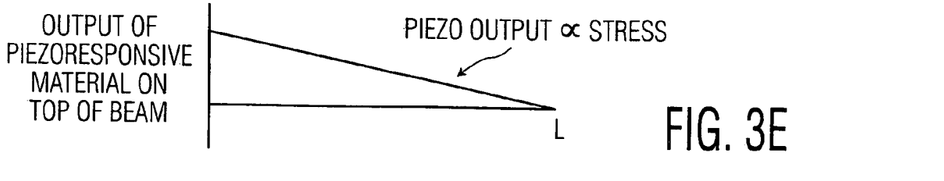
FIG. 3E is a graphical illustration of the output of piezoresponsive material showing the output varying linearly with stress on the beam.
Figure 3F:
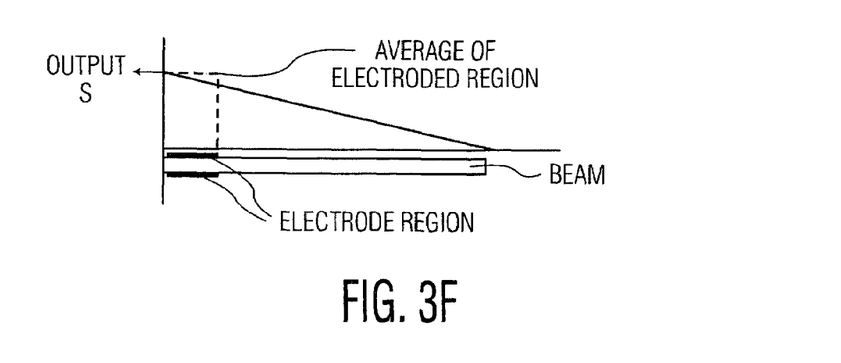
FIG. 3F provides a graphical illustration of the total output signal S as the average output over the active electrode region covered for the case illustrated in FIGS. 3A and 3B.
Figure 3G:
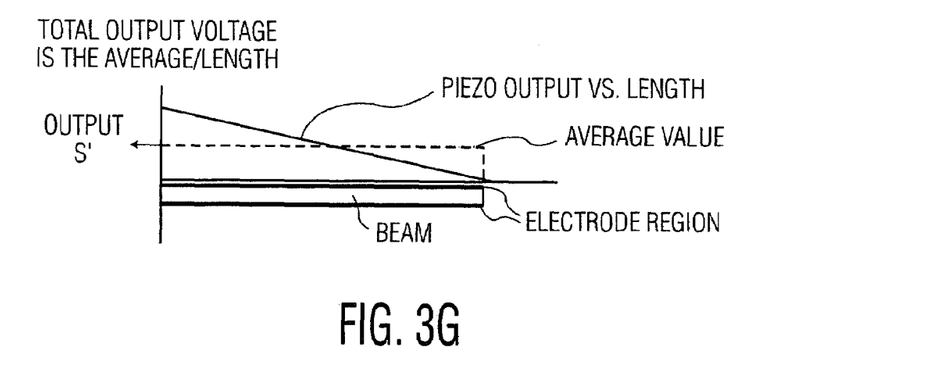
FIG. 3G provides a graphical illustration of the total output signal S' as the average output over the active electrode region covered for the case illustrated in FIG. 3H.
Figure 3H:
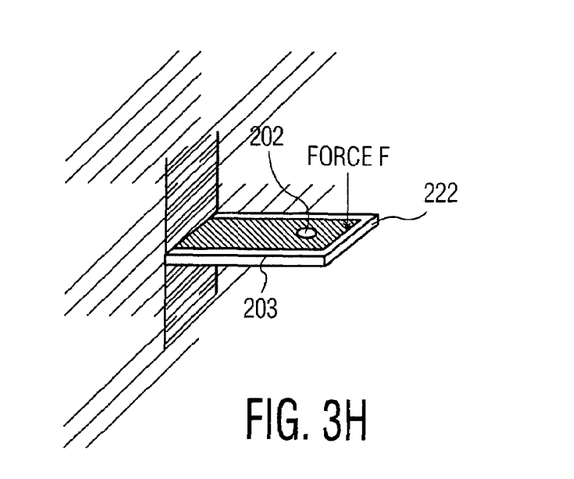
FIG. 3H shows a cantilever beam structure wherein the upper and lower electrode layers define an active electrode region that covers substantially the entire area of the piezoelectric layer.

FIG. 3C illustrates a side view of the cantilever beam sensor structure having a force F applied to the tip of the beam. FIG. 3D is a graphical illustration of the relevant stress on the beam, with the stress level decreasing linearly with beam length based on tip force. FIG. 3E is a graphical illustration of the output of the piezoresponsive material and shows the output varying linearly with stress on the beam. FIG. 3F provides a graphical illustration of the total output signal S as the average output over the active electrode region covered for the case illustrated in FIGS. 3A and 3B. As shown, the electrodes cover only a small portion of the active piezoresponsive region. In contrast, FIG. 3G provides a graphical illustration of the total output signal S' as the average output over the active electrode region covered for the case illustrated in FIG. 3H, wherein the upper and lower electrode layers define an active electrode region that covers substantially the entire area of the piezoelectric layer.

Furthermore, while there has been shown a single mass positioned at the end of the beam structure, it is also contemplated to add one or more additional masses to increase sensor output. It is further contemplated that the overall device will function simply as the result of the "self loading" of the mass of the piezoresponsive material and the support beams without the need for any additional mass. All such variations and modifications are intended to be within the scope of the appended claims.

What is claimed is:
1. A sensor, comprising:
   a first sheet of piezoelectric material defining first and second broad sides, and, in registry on said first and second broad sides, first, second and third nonoverlapping regions, said first sheet of piezoelectric material further defining proximal and distal ends:

a first sheet of electrical conductor extending over, and in contact with, said second and third regions of said first broad side of said first sheet of piezoelectric material, and not over or in contact with said first region;

a second sheet of electrical conductor extending over, and in contact with, said first and second regions of said second broad side of said first sheet of piezoelectric material, and not over or in contact with said third region;

whereby that second region of said first sheet of piezoelectric material lying between said second regions of said second and third sheets of conductive material, when strained, produces a sensor voltage between said second and third sheets of electrical conductor; and first and second electrically conductive means making contact with said first and second sheets of electrical conductor, for making signals from said first sheet of piezoelectric material available as a sensor signal.

2. A sensor according to claim 1, further comprising:

a support structure including first and second mating clamp elements adjacent said first and second broad sides of said first sheet of piezoelectric material, respectively, near said proximal end of said first sheet of piezoelectric material, said clamp elements being tightly clamped together so as to firmly affix a portion of said distal end of said first sheet of piezoelectric material to said support structure.

3. A sensor according to claim 2, wherein said first and second mating clamp elements have a common registered edge facing said distal end of said first sheet of piezoelectric material.

4. A sensor according to claim 1, further comprising a third sheet of electrical conductor extending over, and in contact with, said first region of said first broad side of said first sheet of piezoelectric material, and not over or in contact with said second and third regions, said first and third sheets of electrical conductor being electrically isolated from each other.

5. A sensor according to claim 4, further comprising at least one plated-through hole extending through said first sheet of piezoelectric material in said first region, for making electrical connection between said second and third sheets of electrical conductor.

6. A sensor according to claim 5, wherein said first and second electrically conductive means make electrical contact with said second sheet of electrical conductor through said plated-through hole.

7. A sensor according to claim 1, further comprising a support sheet mechanically coupled to said first sheet of piezoresponsive material for aiding in support thereof and for providing a neutral flexural axis for the overall assembly such that average length extensional stress through the thickness of the piezoresponsive layer resulting from flexure of the tip has enhanced magnitude.

8. A sensor according to claim 7, wherein said support sheet comprises a polymer.

9. A sensor according to claim 8, wherein said polymer is MYLAR.

10. A sensor according to claim 7, wherein said support sheet comprises a metal.

11. A sensor according to claim 10, wherein said metal comprises at least one of NiCu, BeCu, spring steel, and tempered brass.

12. A sensor according to claim 1, further comprising:

a second sheet of piezoelectric material defining first and second broad sides, and, in registry on said first and second broad sides:

a third sheet of electrical conductor extending over, and in contact with said first broad side of said second sheet of piezoelectric material in said first and second regions, and not extending over or in contact with said first broad side of said second sheet of piezoelectric material in said third region;

a fourth sheet of electrical conductor extending over, and in contact with, said second broad side of said second sheet of piezoelectric material in said second and third regions, and not extending over or in contact with said second broad side of said second sheet of piezoelectric material in said first region third electrical conduction means coupled to said first electrically conductive means for interconnecting said third sheet of electrical conductor with said second sheet of electrical conductor; and fourth electrical conduction means coupled to said second electrically conductive means and to said fourth sheet of electrical conductor, for interconnecting said fourth sheet of electrical conductor with said first sheet of electrical conductor.

13. A sensor according to claim 12, wherein said third electrical conduction means includes a fifth sheet of electrical conductor lying over, and in contact with, said second broad side of said second sheet of piezoelectric material in said first region, and not in electrical communication with said fourth sheet of electrical conductor.

14. A sensor according to claim 1, wherein said first sheet of piezoelectric material includes one of PVDF and PVDF-TrFE.

15. A sensor according to claim 8, wherein said support sheet is piezoresponsive.

16. A sensor according to claim 8, wherein said support sheet comprises at least one of PZT, PZLT, PMN-PT, and BaTiO3.

17. A sensor according to claim 8, wherein said support sheet comprises at least one of PET, PVDF, polyimide, polyamide, and polycarbonate polymers.

18. A sensor according to claim 1, wherein said first sheet of piezoelectric material further defines proximal and distal ends, and further comprising:

a support structure including first and second mating clamp elements adjacent said first and second broad sides of said first sheet of piezoelectric material, respectively, near said proximal end of said first sheet of piezoelectric material, said clamp elements being tightly clamped together so as to firmly affix a portion of said distal end of said first sheet of piezoelectric material to said support structure; and at least a portion of said first and second electrically conductive means being integrated with at least one of said first and second mating clamp elements.

19. A sensor according to claim 1, wherein said first sheet of piezoelectric material further defines proximal and distal ends, and further comprising:

a support structure including first and second mating clamp elements adjacent said first and second broad sides of said first sheet of piezoelectric material, respectively, near said proximal end of said first sheet of piezoelectric material; and at least one holding means for holding said clamp elements tightly clamped together so as to firmly affix a portion of said distal end of said first sheet of piezoelectric material to said support structure.

20. A sensor according to claim 19, wherein said holding means comprises a screw.

21. A sensor according to claim 19, wherein said holding means comprises a rivet.

22. A sensor according to claim 19, wherein said holding means comprises an eyelet.

23. A sensor according to claim 1, wherein said first sheet of piezoelectric material further defines proximal and distal ends, and further comprising:
- a support structure including first and second mating clamp elements adjacent said first and second broad sides of said first sheet of piezoelectric material, respectively, near said proximal end of said first sheet of piezoelectric material; and
- at least one holding means for holding said clamp elements tightly clamped together so as to firmly affix a portion of said distal end of said first sheet of piezoelectric material to said support structure, said holding means comprising one of a rivet, an eyelet, and a screw, and said first and second electrically conductive means are at least partially integrated into said holding means.

24. A sensor according to claim 12, wherein:
- said first sheet of electrical conductor extends substantially over the entirety of said first sheet of piezoelectric material, and said second sheet does not extend over said entirety of said first sheet of piezoelectric material; and
- said fourth sheet of electrical conductor extends substantially over the entirety of said second sheet of piezoelectric material, and said third sheet of conductive material does not extend over said entirety of said second sheet of piezoelectric material, whereby said first and fourth sheets of electrical conductor provide electrostatic shielding.

25. A sensor according to claim 1, further comprising a mass element located near said distal end of said piezoresponsive assembly.

26. A sensor according to claim 25, wherein said mass element is bipartite so as to comprise first and second subelements, and wherein said first subelement is located on said first broad side of said a first sheet of piezoelectric material and said second subelement is located on said second broad side said a first sheet of piezoelectric material.

27. A sensor according to claim 25, wherein said mass element is one of magnetic and magnetically permeable, whereby said mass is subject to a body force in the presence of a magnetically permeable material and a magnet, respectively, thereby causing at least a portion of the output signal of said sensor to be responsive to said magnetically permeable material or said magnet.

28. A piezoelectric device comprising:
- a flexible, beam-like substrate defining proximal and distal ends;
- a piezoelectric assembly attached to at least a portion of said substrate, said piezoelectric assembly comprising a sheet of piezoelectric material defining first and second broad surfaces, and first outer and second inner sheets of electrically conductive material overlying, and in contact with, said first and second broad sides, respectively;
- a support structure affixed near said proximal end of said substrate for holding said substrate in a cantilever manner whereby said substrate can flex in the region between said support structure and said distal end of said substrate, and said substrate cannot flex in the region supported by said support structure;
- electrical connection means associated with and supported at least in part by said support structure, for making contact with said first and second sheets of conductive material and providing electrical access to said first and second sheets of conductive material by way of said support structure; and
- a mass element affixed near said distal end of said substrate.

29. A device according to claim 28, wherein said support structure comprises upper and lower clamp portions, said upper and lower clamp portions being registered with each other, and located above and below said piezoelectric assembly, respectively; and
- means for holding said upper and lower clamp portions tightly together, so that said piezoelectric assembly is clamped therebetween.

30. A device according to claim 28, wherein one of said upper and lower clamp portions has at least one edge registered with a corresponding edge of the other of said upper and lower clamp portions, and said one edge of each of said upper and lower clamp portions is the most distal portion of said support structure, thereby providing a known mechanical boundary condition of said piezoelectric assembly.

31. A device in accordance with claim 28 further comprising:
- a second sheet of piezoelectric material, defining first and second broad surfaces, and first outer and second inner sheets of electrically conductive material overlying, and in contact with, said first and second broad sides; and
- a flexible substrate sandwiched between said first and second sheets of piezoelectric material, wherein the two piezoelectric sheets are connected electrically in series with piezoelectric polarities arranged such that a deflection of the free end of the flexible substrate causes addition of the electrical output from the two piezoelectric sheets, thereby enabling an electrical potential to be externally connected to the outer electrode of each piezoelectric sheet to form an electrical shield for the inner electrodes.

32. A device in accordance with claim 28, wherein at least one of said first and second sheets of electrically conductive material is applied only in a region of the piezoelectrically active surface that is substantially less than the total active surface such that the area of the overlapping portions of the two electrode layers is substantially less than the overall surface area of the piezoelectric layer.

* * * * *